United States Patent [19]

Oppermann et al.

[11] Patent Number: 5,291,040
[45] Date of Patent: Mar. 1, 1994

[54] DEACTIVATABLE THYRISTOR WITH TURN-OFF CURRENT PATH

[75] Inventors: Klaus-Guenter Oppermann, Holzkirchen; York Gerstenmaier, Munich; Michael Stoisiek, Ottobrunn, all of Fed. Rep. of Germany

[73] Assignee: Siemens Aktiengesellschaft, Munich

[21] Appl. No.: 759,668

[22] Filed: Sep. 13, 1991

[30] Foreign Application Priority Data

Sep. 25, 1990 [DE] Fed. Rep. of Germany ....... 4030299

[51] Int. Cl.⁵ .................... H01L 29/00; H01L 29/74
[52] U.S. Cl. .................... 257/133; 257/154; 257/164; 257/137; 257/138
[58] Field of Search .................... 257/123–125, 257/133, 137, 138, 154, 164, 176

[56] References Cited

U.S. PATENT DOCUMENTS

| | | | |
|---|---|---|---|
| 4,500,902 | 2/1985 | Herberg | 257/154 |
| 4,502,071 | 2/1985 | Herberg | 257/133 |
| 4,604,638 | 8/1986 | Matsuda | 257/164 |
| 4,646,117 | 2/1987 | Temple | 257/164 |
| 4,743,950 | 5/1988 | Roggwiller | 257/164 |
| 4,753,896 | 6/1988 | Matloubian | 257/350 |

Primary Examiner—Rolf Hille
Assistant Examiner—Mahshid Saadat
Attorney, Agent, or Firm—Hill, Steadman & Simpson

[57] ABSTRACT

An emitter of a thyristor is divided into a plurality of emitter regions. An electrode is provided next to each of these regions, and a turn-off current path proceeds via this electrode from the base adjoining the emitter region over a first field effect transistor to a main terminal of the thyristor. Every emitter region is also connected to this main terminal via a second field effect transistor which is integrated into the semiconductor body of the thyristor, or is manufactured in thin-film technology.

15 Claims, 1 Drawing Sheet

DEACTIVATABLE THYRISTOR WITH TURN-OFF CURRENT PATH

BACKGROUND OF THE INVENTION

The invention is directed to a deactivatable thyristor having four successive semiconductor layers of different conductivity types forming an emitter of first conductivity type, a base of second conductivity type, a base of first conductivity type, and an emitter of second conductivity type, and wherein the emitter of the first conductivity type is divided into a plurality of emitter regions that are connected to a first main terminal, the emitter of the second conductivity type being connected to a second main terminal.

Earlier European Patent Application No. 90 104 736.5, incorporated herein, discloses a thyristor of this type wherein every emitter region is connected via an individually allocated resistor element to a first main terminal. The resistor element is designed as a coating of resistive material which is applied onto an electrically insulating layer that covers the first principal surface. Such resistor elements, however, lead to an undesirable increase in the voltage drop thereat in the conductive condition of the thyristor.

SUMMARY OF THE INVENTION

An object of the invention is to specify a thyristor of the type initially cited wherein a thermal destruction given deactivation is reliably avoided without having the resistor elements employed which lead to an increase in the voltage drop thereat in the conductive condition of the thyristor.

According to the invention, the plurality of emitter regions are connected by individually allocated resistor elements to a first main terminal. A turn-off current path is provided by use of a first field effect transistor which activates the turn-off current path upon deactivation of the thyristor. This turn-off current path proceeds from the base of second conductivity type to the first main terminal next to each emitter region. The first field effect transistors of all turn-off current paths comprise a shared gate terminal. Each of the resistor elements is formed of a second field effect transistor which comprises the allocated emitter region, the semiconductor region of first conductivity type inserted into the base of second conductivity type and spaced from the allocated emitter region, and a portion of the base of second conductivity type lying between the first conductivity semiconductor region and the allocated emitter region. A first gate electrode is provided arranged over the portion of the base of second conductivity type and is insulated with respect to the principal surface of the device.

An advantage obtainable with the invention is that the resistor elements integrated into the emitter structures of the thyristors and designed as switchable field effect transistors cause only an extremely slight voltage drop-off in the conductive condition of the thyristor. Upon deactivation of the thyristor, they each respectively completely interrupt the connection from the emitter regions to the first main terminal.

DESCRIPTION OF THE PREFERRED EMBODIMENTS

Figure 1:
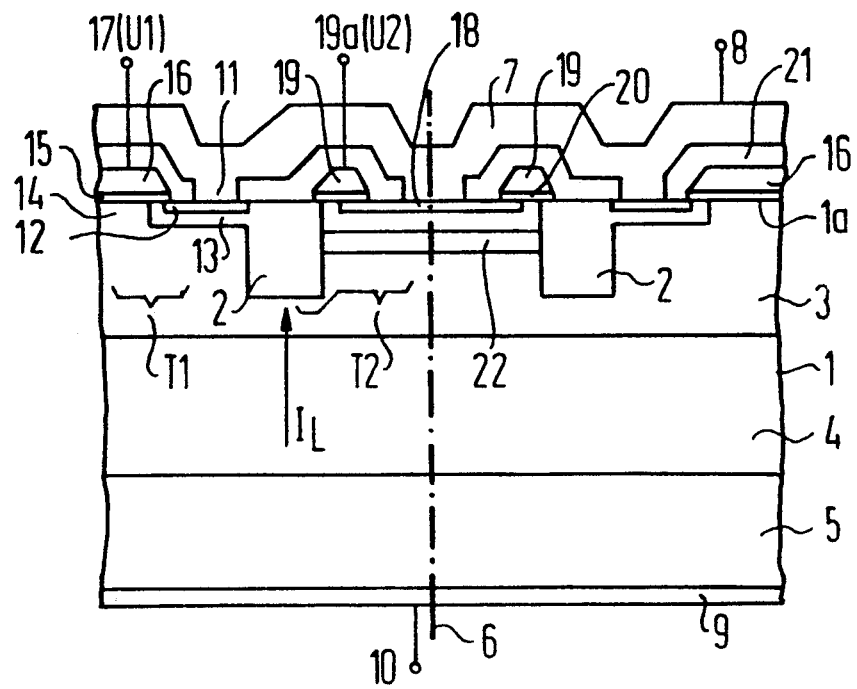
FIG. 1 is a first exemplary embodiment having resistor elements integrated into the semiconductor body of the thyristor.

FIG. 1 shows a schematic sectional view of a part of a deactivatable thyristor having a semiconductor body 1 composed of doped semiconductor material, for example silicon. The illustrated part contains an n-conductive emitter region 2 that is inserted into a p-conductive layer 3 that forms the p-base. An n-conductive layer lying therebelow represents the n-base 4, whereas the lowest p-conductive layer forms the p-emitter 5 of the thyristor. The emitter region 2 that proceeds from the upper principal surface 1a of the thyristor has, for example, an approximately hollow-cylindrical shape closed in itself that is symmetrical vis-a-vis a vertical axis 6. Another shape of this region, for example, could be that of a rectangular or, respectively, quadratic frame oriented in a lateral direction. In both instances, a further cross section that is placed through the axis 6 perpendicular to the plane of the drawing of FIG. 1 would be congruent with the cross section of FIG. 1 set forth up to now. The switchable thyristor is composed of many parts designed in accordance with FIG. 1 which are arranged side-by-side and following one another. The layers 3 through 5 are thus designed as layers proceeding over the entire thyristor cross section, whereas the emitter region 2 together with the corresponding emitter regions of the remaining parts form the uppermost, n-conductive layer of the thyristor, and thus the n-emitter thereof.

The n-emitter region 2 is connected via a resistor element (to be described later) to a conductive coating 7 which is connected to a cathode-side main terminal 8. The p-emitter 5 is provided with an anode-side electrode 9 that is connected to a second, anode-side main terminal 10. The conductive coating 7 thus connects the n-emitter regions of all thyristor parts to the first main terminal 8, whereas the anode-side electrode 9 is shared by all thyristor parts.

An electrode 11 that is composed of a part of the conductive coating 7 and is thus likewise conductively connected to the main terminal 8 is provided next to every n-emitter region 2 and is allocated thereto. The electrode 11 contacts a p-conductive semiconductor zone 12 that is inserted into a lateral shoulder 13 of the n-emitter region 2. Together with the part 14 of the p-base 2 adjoining the shoulder 13 and the edge part of the lateral shoulder 13 lying between 12 and 14 which is covered by a gate electrode 16 separated from the principal surface 1a by a thin, electrically insulating layer 15, the zone 12 forms a first field effect transistor T1 that connects the p-base 3 to the conductive coating 7 and then to the main terminal 8. This connection represents a turn-off current path for the illustrated thyristor part. The gate electrode 16 together with the corresponding gate electrodes of the remaining thyristor parts are connected to a shared gate terminal 17.

The resistor element that connects the n-emitter region 2 to the conductive coating 7 is composed of a second field effect transistor T2. This comprises an edge-side part of the n-emitter region 2, and an n-conductive semiconductor region 18 inserted into the p-base 3 and a part of the p-base 3 that lies between 2 and 8 and adjoins the principal surface 1a. This p-base 3 is covered by a gate electrode 19. The latter is separated from the principal surface 1a by a thin, electrically insulating layer 20. The gate electrode 19 comprises a terminal 19a. 21 references an intermediate insulation layer composed, for example, of $SiO_2$ that separates the parts 16 and 19 from the conductive coating 7.

When the thyristor is in the current-carrying condition, then a portion $I_L$ of the load current flowing onto the illustrated thyristor part flows from the main terminal 1? via the electrode 9 to the n-emitter region 2. It then flows from region 2 via the transistor T2 (which is activated by a positive voltage U2 supplied to the terminal 19a) to the coating 7, and flows via this coating to the main terminal 8. T1 is inhibited at this time by supplying a positive voltage U1 to the terminal 17.

When the thyristor is deactivated, T1 is then activated by supplying a negative voltage U1 to the terminal 17, whereas T2 is inhibited by supplying a negative voltage U2 to the terminal 19a. That part $I_L$ of the load current is thus no longer supplied to n-emitter region 2 but is supplied via the activated turn-off current path 3, 14, 12 and 11 to the coating 7, and thus to the main terminal 8, so that the thyristor is quenched. A considerable voltage drop thus occurs at the inhibited transistor T2, this voltage also being supplied to the semiconductor zone 12 via the conductive coating 7. Thus, the diversion of the illustrated part $I_L$ of the load current onto the turn-off current path is reliably accomplished. A reliable, non-destructive deactivation of the thyristor is thus achieved, even if, as a result of current filamenting, the part $I_L$ of the load current in individual thyristor parts were greater than in others. The provision of the transistors T2 in the individual thyristor parts also manages a disconnection from load current portions that are significantly higher than others.

According to an advantageous development of the exemplary embodiment of the invention set forth above, an insulating layer 22 is inserted in the p-base 3 under the n-conductive semiconductor 18 in order to clearly distinguish the turn-off current path 3, 14, 12, 11, 8 from the load current path in the current-carrying operating condition of the thyristor. The insulating layer 22 can be produced by a deep implantation of Oz ions into the semiconductor body 1. A possible alternative thereto is in designing the layer 22, not as an insulating layer, but as a layer having a greatly reduced carrier life span. This is preferably achieved by a deep implantation of ions of a substance such as, for example, argon, helium or nitrogen, which destroys the crystal lattice of the semiconductor body within the layer 22. As a further alternative, the layer 22 can also be designed as a highly doped p-zone, this being capable of being implemented by a deep implantation of the dopant, for example boron, employed for doping the p-base 3.

Figure 2:
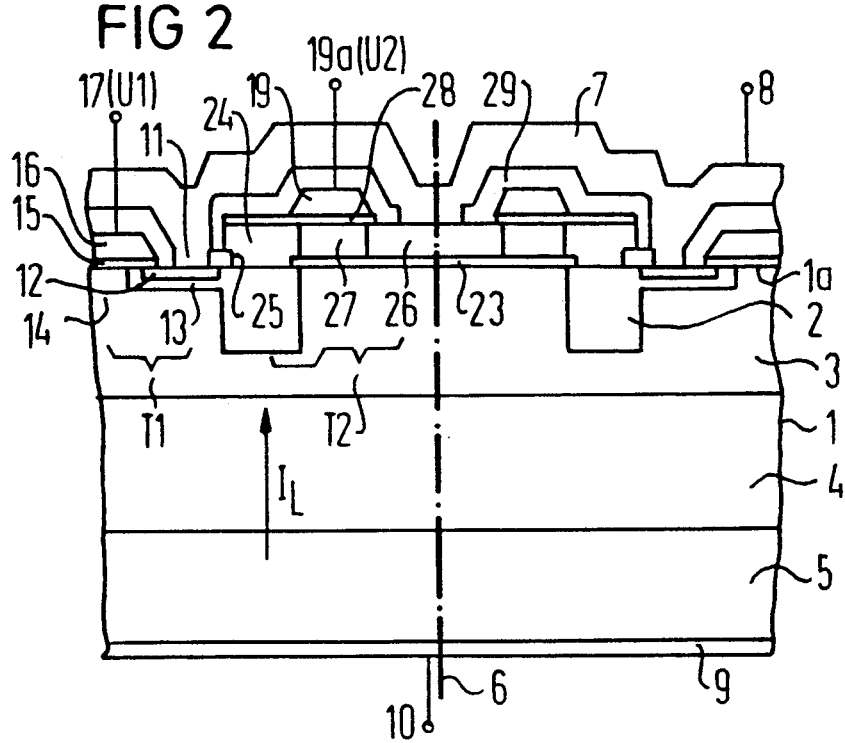
FIG. 2 is a second exemplary embodiment having resistor elements realized in thin-film technology.

The exemplary embodiment of the invention shown in FIG. 2 has the same structure within the semiconductor body 1 as the exemplary embodiment of FIG. 1. The semiconductor region 18 is merely eliminated. Differing from Figure the field effect transistor T2 representing the resistor element is realized in thin-film technology here. In detail, a thin, electrically insulating layer 23 is thus applied on the principal surface 1a in the region of the n-emitter region 2. A layer of doped semiconductor material is then epitaxially grown on the layer 23, this epitaxial layer comprising a first, $n^+$-doped terminal region 24, a second, $n^+$-doped terminal region 26, and a p-doped channel region 27 lying therebetween. The terminal region 24 contacts the n-emitter region 2 in a through hole 25 of the insulating layer 23. The channel region 27 is covered by an insulating layer 28 onto which the gate electrode 19 of T2 is then applied. 29 references an intermediate insulating layer which electrically insulates the gate electrodes 16 and 19 from the conductive coating 7. The functioning of the exemplary embodiment of FIG. 2 corresponds to that of the exemplary embodiment of FIG. 1.

Further embodiments of the invention result if all semiconductor regions or layers are replaced by those of the opposite conductivity type, whereby the voltages that are supplied are to be replaced by those having the opposite operational sign.

Although various minor changes and modifications might be proposed by those skilled in the art, it will be understood that we wish to include within the claims of the patent warranted hereon all such changes and modifications as reasonably come within our contribution to the art.

We claim as our invention:

1. A gate turn-off thyristor, comprising:
   an emitter of a first conductivity type and comprising a plurality of emitter regions, each of which is connected by a resistor element to a first main terminal;
   a base of a second conductivity type adjacent to the plurality of emitter regions;
   a base of a first conductivity type adjacent to the base of second conductivity type;
   an emitter of second conductivity type adjacent to the base of the first conductivity type and having a second main terminal connected thereto;
   a turn-off current path from the second conductivity type base to the first main terminal being provided at each emitter region by an electrode which is connected to said first main terminal, and a first field effect transistor connected between said electrode and second conductivity type base for activating the turn-off current path upon deactivation of the thyristor at each emitter region, gates associated with each of the first field effect transistors connecting to a shared first gate terminal; and
   each of said resistor elements comprising a second field effect transistor comprised of the respective emitter region, a semiconductor region of first conductivity type inserted int he second conductivity base at a spacing from said first conductivity semiconductor region, and a portion of the second conductivity base lying between the first conductivity semiconductor region and the respective emitter region, and a gate electrode overlying said portion of said second conductivity type base and insulated therefrom by an insulating layer.

2. A thyristor according to claim 1 wherein a second conductivity type semiconductor zone is provided between said electrode and a shoulder-like extension of the respective emitter region.

3. A thyristor according to claim 1 wherein the first field effect transistor comprises a second conductivity type semiconductor zone inserted into a lateral shoulder of the respective emitter region, a portion of the second conductivity type base lying spaced from and adjacent to said shoulder, and an edge portion of said lateral shoulder lying between the second conductivity type base portion and said second conductivity type semiconductor zone in the lateral shoulder, said lateral shoulder edge portion lying between and being covered by said gate electrode of said first field effect transistor.

4. A thyristor according to claim 1 wherein an insulating layer is introduced into said second conductivity type base under said first conductivity type semiconductor region.

5. A thyristor according to claim 1 wherein a zone having greatly reduced carrier life span is introduced into the second conductivity base under the first conductivity type semiconductor region.

6. A thyristor according to claim 1 wherein the second conductivity type base has a zone having elevated doping concentration under the first conductivity type semiconductor region.

7. A gate turn-off thyristor, comprising:
an emitter of a first conductivity type and comprising a plurality of emitter regions, each of which is connected by a resistor element to a first main terminal;
a base of a second conductivity type adjacent to the plurality of emitter regions, the emitter regions lying at a principal surface of the base;
a base of a first conductivity type adjacent to the base of second conductivity type;
an emitter of second conductivity type adjacent to the base of the first conductivity type and having a second main terminal connected thereto;
a turn-off current path from the second conductivity type base to the first main terminal being provided at each emitter region by an electrode which is connected to said first main terminal, and a first field effect transistor connected between said electrode and second conductivity type base for activating the turn-off current path upon deactivation of the thyristor at each emitter region, gates associated with each of the first field effect transistors connecting to a shared first gate terminal; and
each of said resistor elements comprising a thin film technology second field effect transistor comprised of first and second terminal regions of first conductivity type and a channel region of second conductivity type between the terminal regions, first and second terminal regions and channel region being insulated from said principal surface, the first terminal region contacting the respective emitter region via a hole and an insulating layer beneath the second field effect transistor, the second terminal region connecting to the first main terminal, and the channel region being covered by a gate electrode arranged in insulated fashion above the channel region.

8. A thyristor according to claim 7 wherein a second conductivity type semiconductor zone is provided between said electrode and a shoulder-like extension of the respective emitter region.

9. A thyristor according to claim 7 wherein the first field effect transistor comprises a second conductivity type semiconductor zone inserted into a lateral shoulder of the respective emitter region, a portion of the second conductivity type base lying spaced from and adjacent to said shoulder, and an edge portion of said lateral shoulder lying between the second conductivity type base portion and said second conductivity type semiconductor zone in the lateral shoulder, said lateral shoulder edge portion lying between and being covered by said gate electrode of said first field effect transistor.

10. A thyristor according to claim 7 wherein an insulating layer is introduced into said second conductivity type base under said first conductivity type semiconductor region.

11. A thyristor according to claim 7 wherein a zone having greatly reduced carrier life span is introduced into the second conductivity base under the first conductivity type semiconductor region.

12. A thyristor according to claim 7 wherein the second conductivity type base has a zone having elevated doping concentration under the first conductivity type semiconductor region.

13. A gate turn-off thyristor, comprising:
a plurality of first conductivity type emitter regions, each of which is connected by a resistor element to a first main terminal;
a second conductivity type base receiving he plurality of emitter regions therein at a surface thereof;
a first conductivity type base adjacent to the second conductivity type base;
a second conductivity type emitter adjacent to the first conductivity type base and having a second main terminal connected thereto;
an electrode connecting to a second conductivity type semiconductor zone in a portion of each emitter region, each of said electrodes connecting to said first main terminal;
a first field effect transistor at each emitter region and formed of a gate overlying the second conductivity type semiconductor zone, said portion of the respective emitter region, and a portion of the second conductivity type base; and
each of said resistor elements comprising a second field effect transistor having a gate overlying a channel, said channel connecting the respective emitter region to the first main terminal when activated.

14. A thyristor according to claim 13 wherein the second field effect transistors comprise the respective emitter region, a portion of the second conductivity type base, and a first conductivity type semiconductor region embedded in the second conductivity type base.

15. A thyristor according to claim 13 wherein the second field effect transistors comprise a thin film technology field effect transistor formed on an insulating layer above the second conductivity type base and including a channel region and terminal regions, one of the terminal regions connecting to the respective emitter region and the other terminal region connecting to the first main terminal, and wherein the gate is provided in insulated fashion over the channel.

* * * * *